United States Patent
Dede et al.

(10) Patent No.: US 10,334,756 B1
(45) Date of Patent: Jun. 25, 2019

(54) MANIFOLD STRUCTURES HAVING AN INTEGRATED FLUID CHANNEL SYSTEM AND ASSEMBLIES COMPRISING THE SAME

(71) Applicant: Toyota Motor Engineering & Manufacturing North America, Inc., Plano, TX (US)

(72) Inventors: Ercan M. Dede, Ann Arbor, MI (US); Jongwon Shin, Ann Arbor, MI (US); Yanghe Liu, Ann Arbor, MI (US); Jae Seung Lee, Ann Arbor, MI (US)

(73) Assignee: Toyota Motor Engineering & Manufacturing North America, Inc., Plano, TX (US)

(*) Notice: Subject to any disclaimer, the term of this patent is extended or adjusted under 35 U.S.C. 154(b) by 0 days.

(21) Appl. No.: 15/907,926

(22) Filed: Feb. 28, 2018

(51) Int. Cl.
  *H05K 7/20* (2006.01)
  *H01L 23/473* (2006.01)
  *H01L 23/367* (2006.01)

(52) U.S. Cl.
  CPC ..... *H05K 7/20272* (2013.01); *H01L 23/3677* (2013.01); *H01L 23/473* (2013.01); *H05K 7/20281* (2013.01)

(58) Field of Classification Search
  USPC ......................................................... 361/699
  See application file for complete search history.

(56) References Cited

U.S. PATENT DOCUMENTS

| 7,710,723 B2* | 5/2010 | Korich ............... H05K 7/20927 165/104.33 |
| 8,149,579 B2 | 4/2012 | Jadric et al. |
| 8,482,919 B2* | 7/2013 | Dede ..................... H01L 23/473 165/80.4 |
| 9,066,453 B2 | 6/2015 | Wagner et al. |
| 9,357,668 B2 | 5/2016 | Jones et al. |

(Continued)

FOREIGN PATENT DOCUMENTS

JP   2005026627 A   1/2005

OTHER PUBLICATIONS

Quesnel, Norman, "Industry developments: thermal management solutions for IGBT modules", Aug. 30, 2017; URL: https://www.qats.com/cms/2017/08/30/industry-developments-thermal-management-solutions-igbt-modules/.

(Continued)

*Primary Examiner* — Mukundbhai G Patel
(74) *Attorney, Agent, or Firm* — Dinsmore & Shohl LLP

(57) ABSTRACT

Embodiments described herein generally relate to an assembly including a manifold structure. The manifold structure includes a fluid inlet and a fluid outlet. The fluid inlet is for receiving a cooling fluid into the manifold structure and the fluid outlet is for removing the cooling fluid from the manifold structure. The manifold structure also includes a first cooling surface and an opposite second cooling surface. The first cooling surface includes a cooling chip inlet opening fluidly coupled to a cooling chip outlet opening. The fluid inlet is fluidly coupled to the cooling chip inlet opening. The second cooling surface includes a cavity. A first integrated fluid channel fluidly couples the cooling chip outlet opening to the cavity and a second integrated fluid channel fluidly couples the cavity to the fluid outlet. A cooling chip includes a plurality of microchannels, which fluidly couple the cooling chip to the first cooling surface.

20 Claims, 7 Drawing Sheets

(56) References Cited

U.S. PATENT DOCUMENTS

| | | | |
|---|---|---|---|
| 9,516,789 B2* | 12/2016 | Garriga | H05K 7/209 |
| 9,538,691 B2 | 1/2017 | Kikuchi et al. | |
| 9,581,234 B2 | 2/2017 | Sung et al. | |
| 9,615,490 B2* | 4/2017 | Topolewski | H05K 7/20254 |
| 2017/0054347 A1 | 2/2017 | Lei et al. | |
| 2017/0263531 A1 | 9/2017 | Fukuoka et al. | |
| 2017/0263532 A1 | 9/2017 | Fukuoka et al. | |
| 2018/0025962 A1 | 1/2018 | Dede et al. | |

OTHER PUBLICATIONS

U.S. Appl. No. 15/423,086, filed Feb. 2, 2017; Inventor: Yuji Fukuoka.
U.S. Appl. No. 15/423,636, filed Feb. 3, 2017; Inventors: Yuji Fukuoka et al.
U.S. Appl. No. 15/423,641, filed Feb. 3, 2017; Inventors: Yuji Fukuoka et al.
U.S. Appl. No. 15/782,536, filed Oct. 12, 2017; Inventor: Ercan M. Dede.

* cited by examiner

MANIFOLD STRUCTURES HAVING AN INTEGRATED FLUID CHANNEL SYSTEM AND ASSEMBLIES COMPRISING THE SAME

TECHNICAL FIELD

The present disclosure generally relates to cooling structures and, more specifically, to cooling structures having integrated fluid channel systems to cool multiple heat generating components.

BACKGROUND

Heat sinking devices may be coupled to a heat generating device, such as a power electronics device, to remove heat and lower the maximum operating temperature of the heat generating device. Cooling fluid may be used to receive heat generated by the heat generating device by convective thermal transfer, and remove such heat from the heat generating device. For example, cooling fluid may be directed toward a semiconductor cooling chip to remove heat from the heat generating device.

However, as power electronics are designed to operate at increased power levels and generate increased corresponding heat flux due to the demands of newly developed electrical systems, conventional heat sinks may be unable to adequately remove the heat flux to effectively lower the operating temperature of the power electronics to acceptable temperature levels.

Accordingly, a need exists for alternative power electronics assemblies and power electronics devices having improved cooling structures.

SUMMARY

In one embodiment an assembly includes a manifold structure. The manifold structure includes a fluid inlet and a fluid outlet. The fluid inlet is for receiving a cooling fluid into the manifold structure and the fluid outlet is for removing the cooling fluid from the manifold structure. The manifold structure further includes a first cooling surface and an opposite second cooling surface. The first cooling surface includes a cooling chip inlet opening fluidly coupled to a cooling chip outlet opening. The fluid inlet is fluidly coupled to the cooling chip inlet opening. The second cooling surface includes a cavity. A first integrated fluid channel fluidly couples the cooling chip outlet opening to the cavity. A second integrated fluid channel fluidly couples the cavity to the fluid outlet. A cooling chip includes a plurality of microchannels. The cooling chip is coupled to the first cooling surface of the manifold structure such that the plurality of microchannels is fluidly coupled to the cooling chip inlet opening and the cooling chip outlet opening.

In another embodiment, a cooling assembly includes a manifold structure. The manifold structure includes a fluid inlet and a fluid outlet. The fluid inlet is for receiving a cooling fluid into the manifold structure and the fluid outlet is for removing the cooling fluid from the manifold structure. The manifold structure further includes a first cooling surface and an opposite second cooling surface. The first cooling surface includes a cooling chip inlet opening fluidly coupled to a cooling chip outlet opening. The fluid inlet is fluidly coupled to the cooling chip inlet opening. The second cooling surface includes a cavity. A first integrated fluid channel fluidly couples the cooling chip outlet opening to the cavity. A second integrated fluid channel fluidly couples the cavity to the fluid outlet. A cooling chip that has a plurality of microchannels is disposed within a recess of the first cooling surface of the manifold structure. The plurality of microchannels is fluidly coupled to the cooling chip inlet opening and the cooling chip outlet opening. A planar plate member is coupled to the second cooling surface such that a manifold is defined within the cavity between the second cooling surface and the planar plate member. At least one semiconductor device is thermally coupled to the cooling chip, and at least one inductor is thermally coupled to the planar plate member.

In yet another embodiment, a cooling assembly includes a manifold structure. The manifold structure includes a fluid inlet and a fluid outlet. The fluid inlet is for receiving a cooling fluid into the manifold structure and the fluid outlet is for removing the cooling fluid from the manifold structure. The manifold structure further includes a first cooling surface and an opposite second cooling surface. The first cooling surface includes a first cooling chip inlet opening fluidly coupled to a first cooling chip outlet opening, and a second cooling chip inlet opening fluidly coupled to a second cooling chip outlet opening. The fluid inlet is fluidly coupled to the first cooling chip inlet opening and the second cooling chip inlet opening. The second cooling surface includes a cavity. A first integrated fluid channel fluidly couples the first cooling chip outlet opening and the second cooling chip outlet opening to the cavity. A second integrated fluid channel fluidly couples the cavity to the fluid outlet. A first cooling chip and a second cooling chip each including a plurality of microchannels. The first cooling chip and the second cooling chip are coupled to the first cooling surface of the manifold structure such that the plurality of microchannels of the first cooling chip is fluidly coupled to the first cooling chip inlet opening and the first cooling chip outlet opening, and the plurality of microchannels of the second cooling chip is fluidly coupled to the second cooling chip inlet opening and the second cooling chip outlet opening.

These and additional objects and advantages provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein generally relate to assemblies that includes a manifold structure having an integrated fluid channel system. The integrated fluid channel system receives a dielectric cooling fluid that cools one or more power electronics devices. A cooling chip is mounted into the manifold structure such that the cooling chip is fluidly coupled to the integrated fluid channel system. The one or more power electronic devices are bonded to the cooling chips such that the one or more power electronic devices are directly cooled by the dielectric cooling fluid. Moreover, at least two circuit boards may be mounted to the manifold structure such that the circuit boards are in parallel and cooled by the dielectric cooling fluid of the integrated fluid channel system. As such, this circuit board and power electronics arrangement increases volumetric power density while permitting fewer thermal interfaces, which in turn, reduces the thermal resistance of the assembly. Further, the manifold structure permits significant downsizing of the power electronics packaging by having the manifold structure as part of the electronics as opposed to bolt-on attachment.

Referring generally to the figures, an assembly 10 that has a plurality of electronic devices 12 mounted to a cooling structure, such as a manifold structure 14, is disclosed. An axial length of the assembly is indicated by the line "L" and as used herein, the term "longitudinal direction" refers to the forward-rearward direction of the assembly (i.e., in the +/−X-direction depicted in FIG. 1). The width of the assembly is indicated by the line "W" and as used herein, the term "lateral direction" refers to the cross direction (i.e., in the +/−Y-direction depicted in FIG. 1), and is transverse to the longitudinal direction. The height is indicated by the line "H" and the term "vertical direction" refers to the upward-downward direction of the assembly (i.e., in the +/−Z-direction depicted in FIG. 1).

It should be noted that for ease of describing and understanding the present disclosure, the elements with the "a" designation are separate from the elements with the "b" designation and, as such, unless stated, remain separate whether by position on the manifold structure 14 and/or separated by mechanical device.

Figure 1:
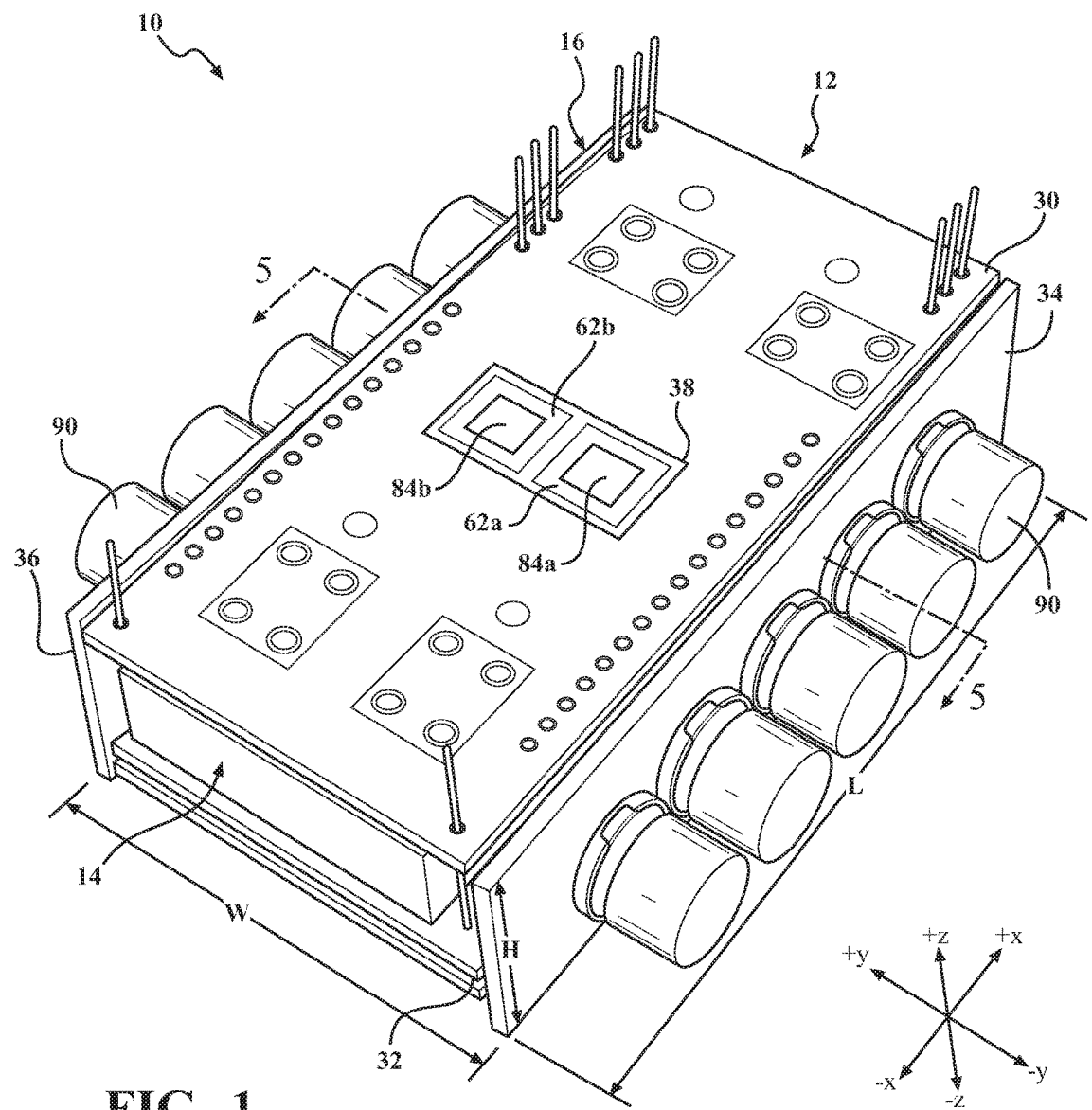
FIG. 1 schematically depicts a perspective view of an example assembly having a manifold structure according to one or more embodiments shown or described herein.

Referring to FIG. 1, a schematic illustration of a perspective view of an example assembly 10 is depicted. The example assembly 10 includes a manifold structure 14, a cooling chip 62a, 62b, and a plurality of electronic devices 12 mounted to a manifold structure 14. A printed circuit board assembly ("PCB assembly") 16, which may include four printed circuit boards ("PCBs"): a first PCB 30, a second PCB 32, a third PCB 34, and a fourth PCB 36, mounted to the manifold structure 14. It should be understood that more or fewer PCBs and/or cooling chips may be provided. It should be appreciated that the PCB may be any substrate providing electrical traces and interconnects and is not limited to being "printed". The PCBs assembly 16 may be arranged around the manifold structure 14 such that each PCB is electrically connected to one another. The PCBs assembly 16 may be constructed of one or more sheet layers of copper laminated onto/between non-conductive substrate. Further, traces or circuit paths are etched into substrate so to form an electrical conductive path.

Each of the PCBs 30, 32, 34, 36 in the PCB assembly 16 may be bonded together which permits such a PCB arrangement, as seen in FIG. 1, where each PCB 30, 32, 34, 36 in the PCBs assembly 16 may be attached or stacked to the manifold structure 14, in a planar arrangement, onto each of the four sides of the manifold structure 14. It should be appreciated that the PCBs assembly 16 does not need to be in this particular arrangement, and further, the PCBs assembly 16 may be a unitary PCB (i.e., not four separate PCBs), such as a flexible type, where the PCB is manufactured such that it is wrapped around the manifold structure 14.

The plurality of electronic devices 12 may be electrically and/or thermally coupled to the PCBs assembly 16. The plurality or electronic devices 12 includes a plurality of passive and active electronic components, such as semiconductor switches 84a, 84b and/or capacitors 90, as will be described in greater detail below. The cooling chips 62a, 62b, which may cool the semiconductor switches 84a, 84b, may comprise a semiconductor material, such as, without limitation Si, GaAs, Ga2O3, SiC, GaN, AlN, BN, diamond, or the like. In one non-limiting example, the cooling chips 62a, 62b and semiconductor switches 84a, 84b may comprise the same semiconductor material, as described in greater detail below with reference to FIGS. 4A-4D. The cooling chips 62a, 62b may be a two piece wafer assembly having a top layer and a bottom layer. A plurality of microchannels that receive cooling fluid to cool the semiconductor devices may be disposed between the top layer and the bottom layer.

The first PCB 30 includes an aperture 38 that permits the cooling chips 62a, 62b and the semiconductor switches 84a, 84b to pass through the first PCB 30 such that the cooling chips 62a, 62b and the semiconductor switches 84a, 84b may be directly coupled to the manifold structure 14, as will be discussed in greater detail below. Although the semiconductor switches 84a, 84b are described as switches herein, embodiments are not limited thereto. The semiconductor switches 84a, 84b may be any semiconductor device or other heat generating device.

Figure 3A:
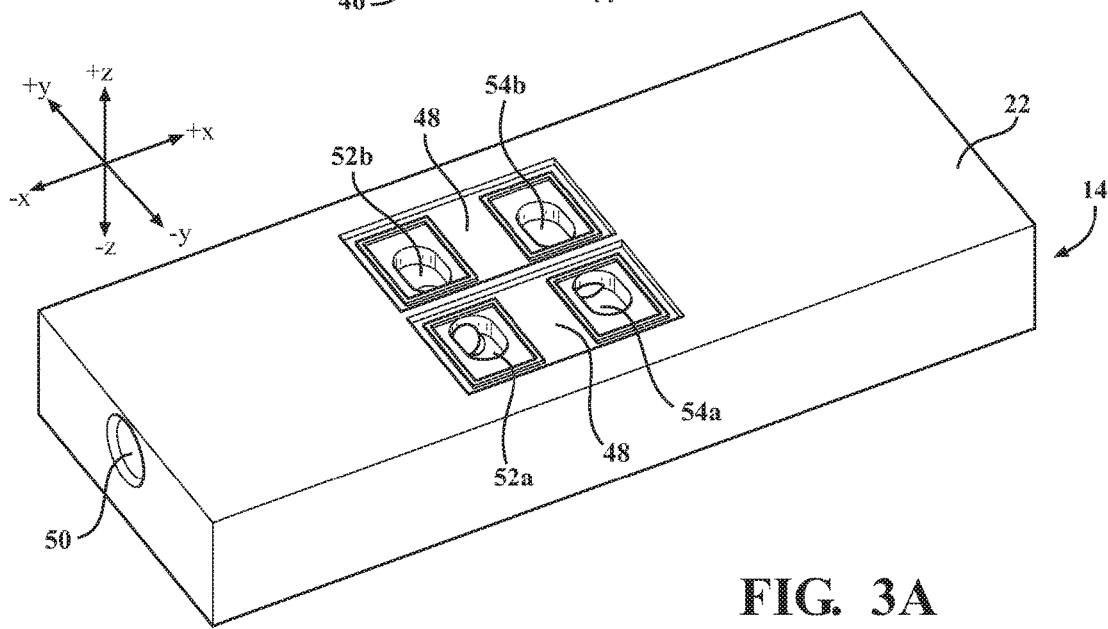
FIG. 3A schematically illustrates an isolated view of an example manifold structure having a first cooling surface of the assembly in FIG. 1 according to one or more embodiments shown or described herein.
Figure 3B:
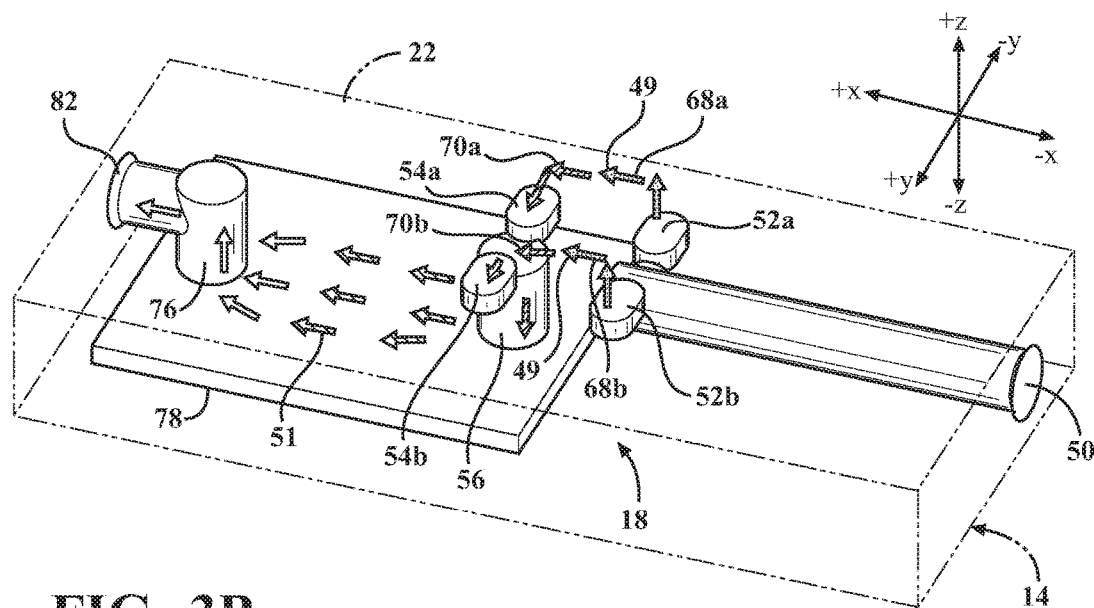
FIG. 3B schematically illustrates an isolated view of an example integrated fluid channel system of the assembly of FIG. 1 according to one or more embodiments shown or described herein.

As will be described in further detail herein, the manifold structure 14 includes an integrated fluid channel system 18 (FIG. 3B), extending the length L of the manifold in the system longitudinal direction (i.e., along the +/−X-axis of the coordinate axes of FIG. 1) that directs a cooling fluid 49 (FIG. 3B) to the PCBs assembly 16. Further, the manifold structure 14 may be fabricated from a material that is thermally conductive such that heat flux generated by the electrical components of the assembly 10 passes through the material of the manifold structure 14 to the cooling fluid 49 flowing therein. However, it should be appreciated that the manifold structure 14 may be made of any material that is thermally, or non-thermally conductive, and able to provide the integrated fluid channel system 18 (FIG. 3B). As a non-limiting example, the manifold structure may be fabricated by either aluminum, polyether ether ketone ("PEEK"), or glass. Further, as an example and not a limitation, the manifold structure 14 may be a unitary mold component. In other embodiments, the manifold structure 14 comprises two or more components that are bonded together.

Figure 2:
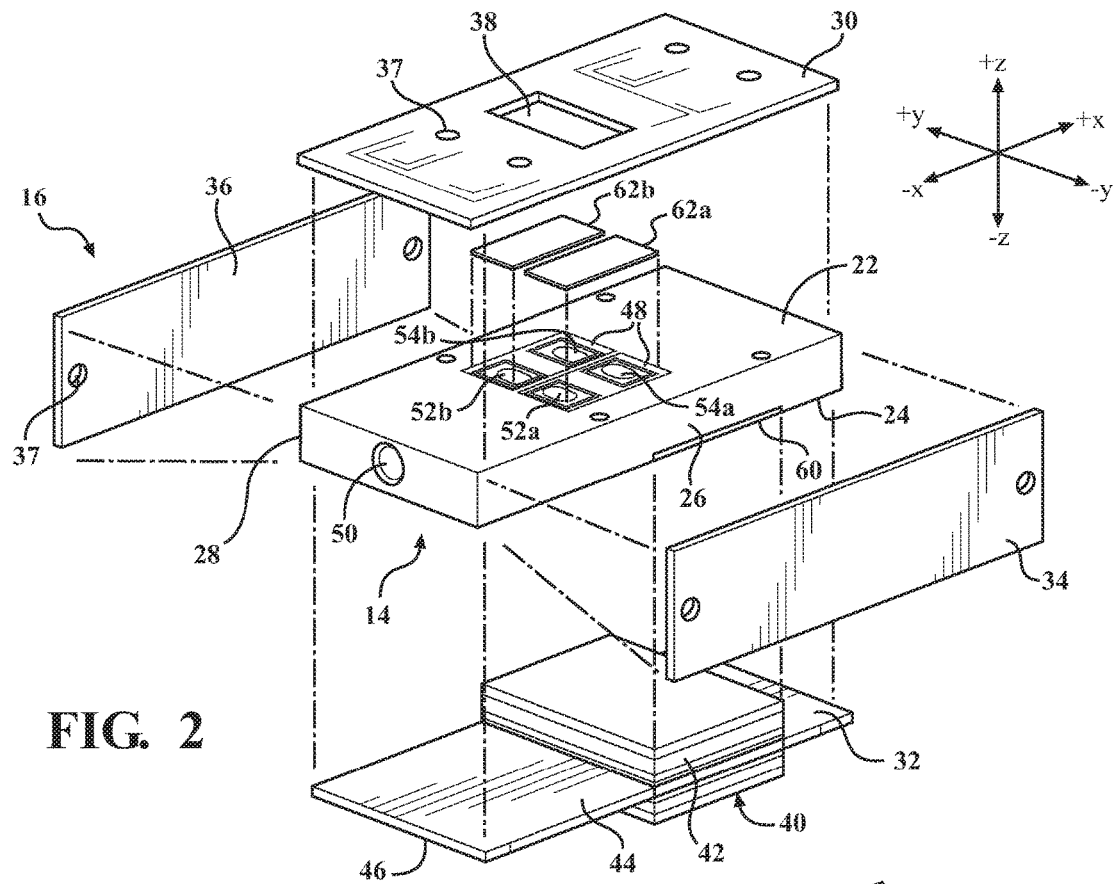
FIG. 2 schematically illustrates an exploded view of the assembly of FIG. 1 according to one or more embodiments shown or described herein.

With reference to FIG. 2, an exploded view of the assembly 10 of FIG. 1 is depicted. The manifold structure 14 includes a first cooling surface 22 and an opposite second cooling surface 24. The manifold structure 14 further includes a first side surface 26 and an opposing second side surface 28. The first PCB 30 may be mounted to the first cooling surface 22, the second PCB 32 may be mounted to the second cooling surface 24, the third PCB 34 may be mounted to the first side surface 26 and the fourth PCB 36 may be mounted to the second side surface 28 of the manifold structure 14. The second PCB 32 may include at least one electronic device to be cooled, such as, without limitation, inductor 40. It should be understood that components other than at least one inductor 40 may be provided on the second PCB 32. The at least one inductor 40 may have a coil 42 disposed on an upper surface 44 of the second PCB 32 or be disposed on both the upper 44 and a lower surface 46 of the second PCB 32. Further, the coil may comprise of multiple copper layers and PCB substrate layers, which may alternate in cross-section, as one skilled in the art would appreciate. The coil 42 may be in contact with the second cooling surface 24 of the manifold structure 14 such that the at least one inductor 40 is cooled by the cooling fluid 49 within the manifold structure 14.

The manifold structure 14 supports the PCB assembly 16 so that each of the four PCBs 30, 32, 34, 36 may be attached to the manifold structure 14. As such, each of the PCBs 30, 32, 34, 36 may include through holes 37 so to attach the PCBs 30, 32, 34, 36 to the manifold structure 14 by fasteners, such as screws and/or bolts and nuts, and/or threaded rod, and/or by a plurality of bonding materials such as, without limitation, epoxy with and without woven glass-reinforcement, Teflon, and/or bondply. It should also be appreciated that a flexible PCB may be used and, as such, each surface of the flexible PCB may not need to be attached to the manifold structure 14. As a result of the PCBs assembly direct mount to the manifold structure 14, the manifold structure 14 may reduce thermal resistance.

With reference still to FIG. 2, the first cooling surface 22 of the manifold structure 14 may include one or more recesses 48 to receive one or more cooling chips 62a, 62b. In the illustrated embodiment, a pair of recesses 48 is provided to receive cooling chips 62a, 62b. It should be understood that any number of recesses and cooling chips may be provided. Each of the recesses 48 may surround a cooling chip inlet opening 52a, 52b and a cooling chip outlet opening 54, 54b. The cooling chip inlet opening 52a, 52b is longitudinally (i.e., along the +/−X-axis of the coordinate axes of FIG. 1) spaced apart from the cooling chip outlet opening 54a, 54b. As such, if there were more than the pair of recesses 48, as shown in in FIGS. 2 and 3A, there may also be more than the cooling chip inlet openings 52a, 52b and the cooling chip outlet openings 54a, 54b. Each additional recess may include an additional cooling chip inlet opening and an additional cooling chip outlet opening. Moreover, it should also be appreciated that the recesses 48 may be disposed in the manifold structure 14 at different positions in the longitudinal direction (i.e., along the +/−X-axis of the coordinate axes of FIG. 1). For example, the recesses 48 may be disposed near an edge of the manifold structure 14.

With reference still to FIG. 2, the cooling chip inlet opening 52a, 52b is fluidly coupled to the cooling chip outlet opening 54a, 54b by the cooling chip 62a, 62b such that the cooling chip inlet opening 52a is fluidly coupled to the cooling chip 62a, and the cooling chip 62a is fluidly coupled to the cooling chip outlet opening 54a. Moreover, the cooling chip inlet opening 52b is fluidly coupled to the cooling chip 62b, which is fluidly coupled to the cooling chip outlet opening 54b. As depicted in FIG. 2, the recesses 48 are laterally (i.e., along the +/−Y-axis of the coordinate axes of FIG. 1) spaced apart so that the recess 48 are positioned side by side. It should be noted that more than the recesses 48 may be positioned in the lateral direction (i.e., along the +/−Y-axis of the coordinate axes of FIG. 1) and/or the recesses 48 may continue, either as a single recess or in pairs of recesses, in the longitudinal direction (i.e., along the +/−X-axis of the coordinate axes of FIG. 1) a predetermined length of the manifold structure 14.

With reference still to FIG. 2, the manifold structure 14 further includes a cavity 58 in the second cooling surface 24. A planar plate member 60 may be attached within the cavity 58 and in contact with the second cooling surface 24. The planar plate member 60 may be made from any suitable material thermally conductive material. The at least one inductor 40 of the second PCB 32 may be thermally coupled to the planar plate member 60. In alternative embodiments, the cavity 58 and the planar plate member 60 do not need to align with the inductor 40 to thermally couple to the inductor 40, therefore, there may be an offset configuration between the inductor 40 and the planar plate member 60.

The integrated fluid channel system 18 of the manifold structure 14 will now be discussed in greater detail. FIG. 3A is an isolated view of the first cooling surface 22 of the manifold structure 14 and FIG. 3B is an isolated view of the integrated fluid channel system 18 of the manifold structure 14 depicted by FIG. 1. The manifold structure 14 includes a fluid inlet 50. The fluid inlet 50 is fluidly coupled to the cooling chip inlet opening 52a, 52b in each of the recesses 48. For example, the manifold structure 14 is illustrated with the pair of recesses 48, each of which may have a cooling chip 62a, 62b coupled therein and each of which may have the cooling chip inlet opening 52a, 52b in fluid communication with the fluid inlet 50. In addition, for each of the cooling chip inlet openings 52a, 52b, there is the longitudinally (i.e., along the +/−X-axis of the coordinate axes of FIG. 1) spaced apart cooling chip outlet opening 54a, 54b. Further, both the cooling chip inlet opening 52a, 52b and the cooling chip outlet opening 54a, 54b are above the fluid inlet 50 in the vertical direction (i.e., in the +/−Z-direction depicted in FIG. 1).

The fluid inlet 50 extends into the manifold structure 14 in the longitudinal direction (i.e., along the +/−X-axis of the coordinate axes of FIG. 1) between the first cooling surface 22 and the second cooling surface 24, until the fluid inlet 50 couples to the cooling chip inlet opening 52a, 52b. As such, and as best depicted in FIG. 3A, the cooling chip inlet opening 52a, 52b and the cooling chip outlet opening 54a, 54b open to the recesses 48 in the first cooling surface 22. It should be appreciated that the fluid inlet 50 may longitudinally (i.e., along the +/−X-axis of the coordinate axes of FIG. 1) extend further into the manifold structure 14 to however many recesses 48 are present and however many of the cooling chip inlet openings that are disposed in the manifold structure 14.

Figure 4A:
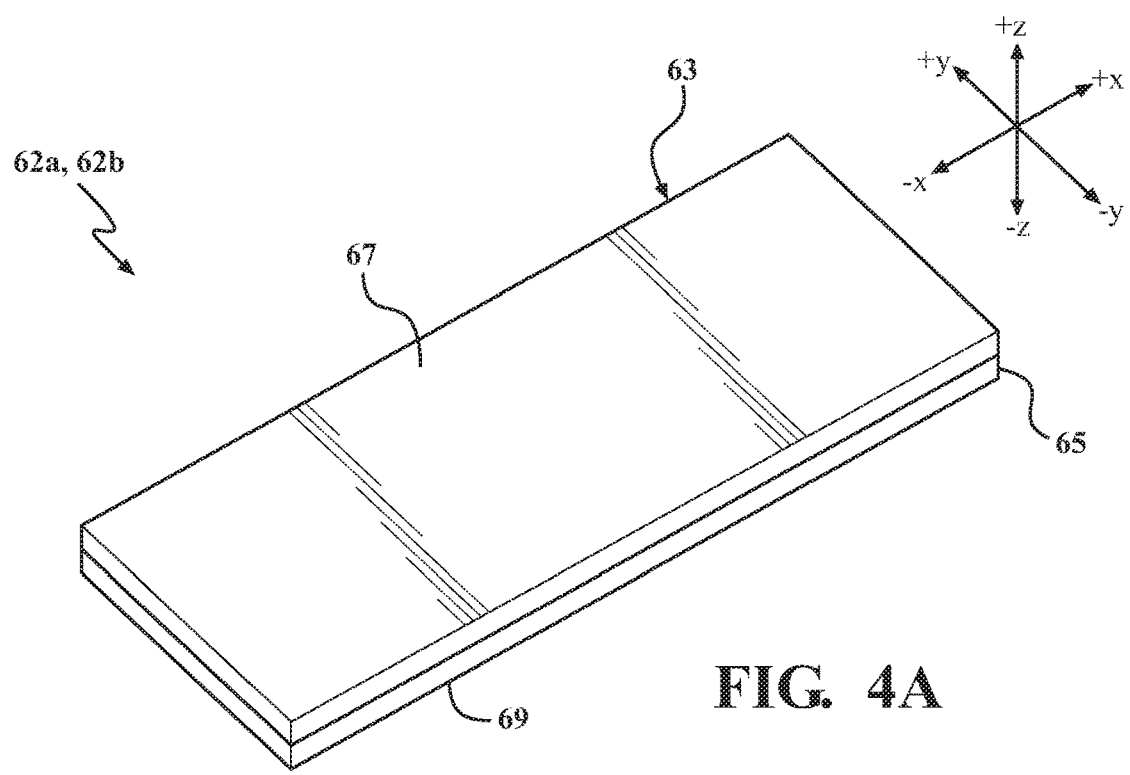
FIG. 4A schematically illustrates an isolated perspective view of an example cooling chip according to one or more embodiments shown or described herein.
Figure 4B:
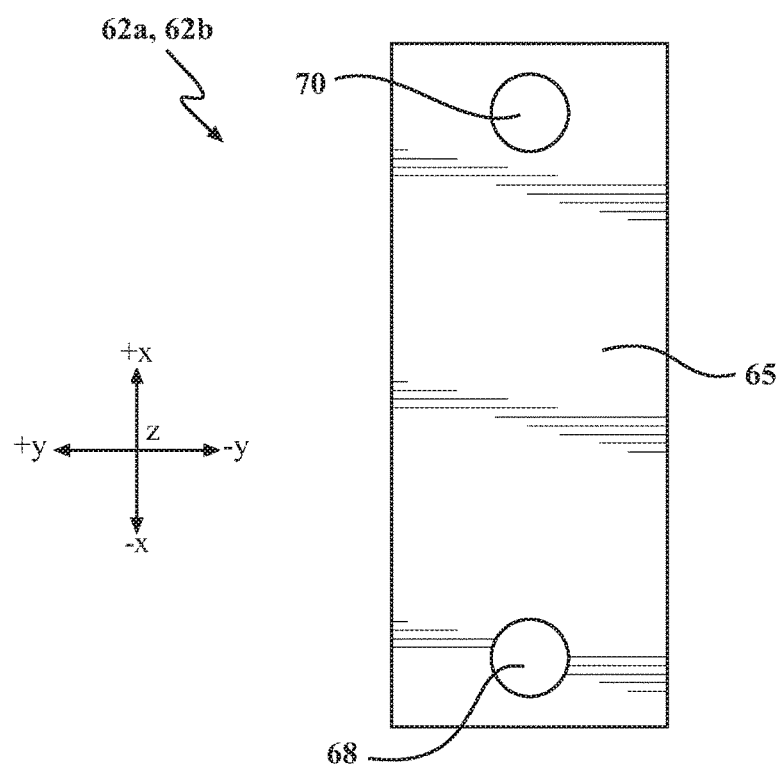
FIG. 4B schematically illustrates an isolated bottom view of the example cooling chip of FIG. 4A according to one or more embodiments shown or described herein.
Figure 4C:
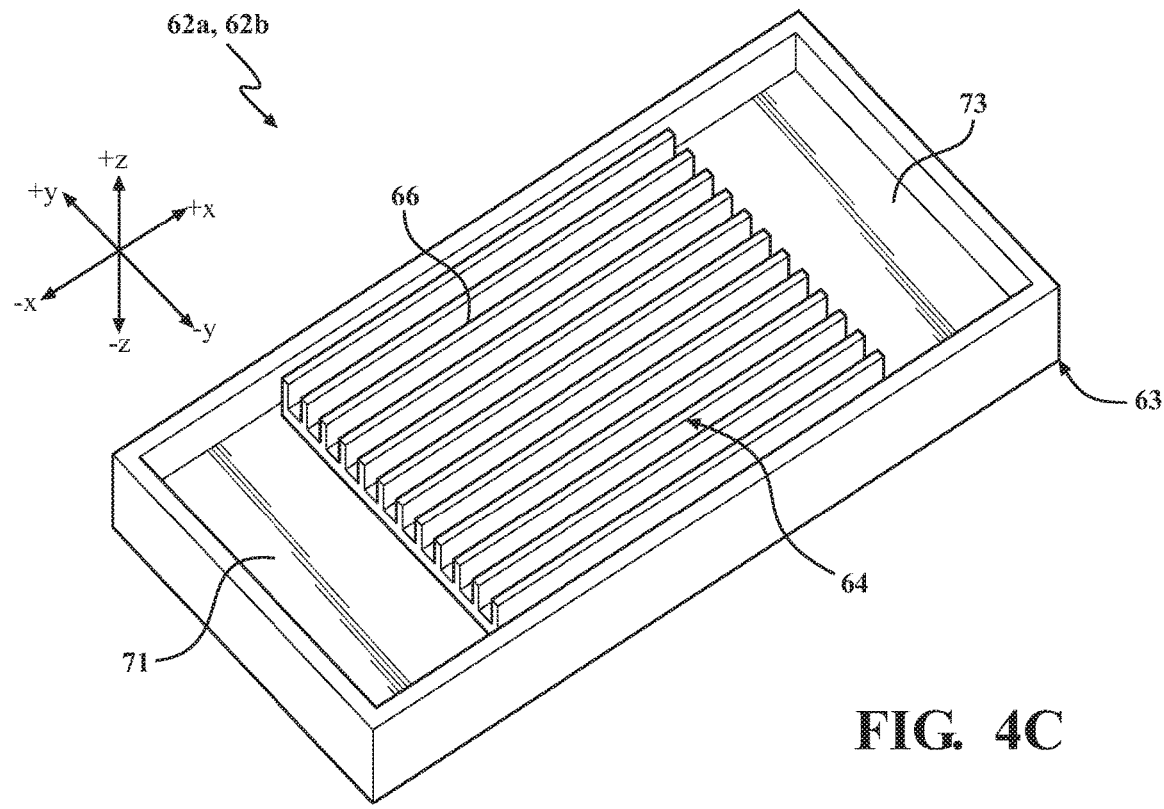
FIG. 4C schematically illustrates an isolated perspective view of an upper layer of the example cooling chip of FIG. 4A according to one or more embodiments shown or described herein.
Figure 4D:
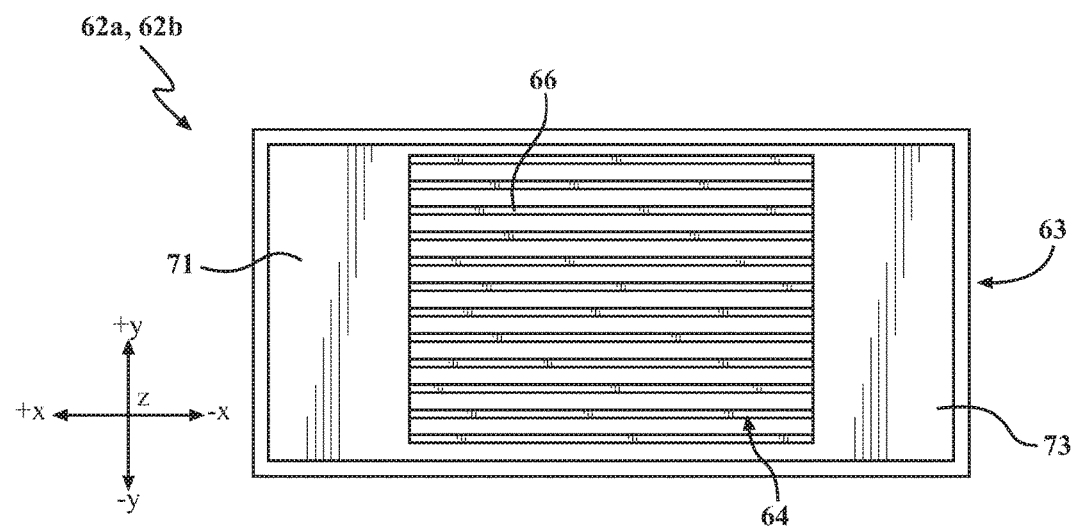
FIG. 4D schematically illustrates an isolated overhead view of the upper layer of the example cooling chip of FIG. 4A according to one or more embodiments shown or described herein.

As stated above, a cooling chip 62a, 62b is disposed within each recess 48. As described in detail below, the cooling chips 62a, 62b include microchannels that fluidly couple the cooling chip inlet openings 52a, 52b to the cooling chip outlet 54a, 54b. FIG. 4A is an isolated view perspective view of the cooling chip 62a, 62b of the assembly 10 of FIG. 1, and FIG. 4B is an isolated bottom view of the cooling chip 62a of the FIG. 4A. FIG. 4C is an isolated perspective view of an upper layer of the cooling chip 62a and FIG. 4D is an overhead view of the upper layer cooling of the cooling chip 62a. While only cooling chip 62a will be described with regards to FIGS. 4A-4D, it should be appreciated that the cooling chips 62a, 62b described herein have similar structure. The recesses 48 of the manifold structure 14 of FIG. 3A may be configured to fit one of the cooling chips 62a, 62b. The cooling chips 62a, 62b may include an upper layer 63 and a lower layer 65. The upper layer 63 is positioned above the lower layer 65 in the system vertical direction (i.e., along the +/−Z-axis of the coordinate axes of FIG. 1). Further, the upper layer 63 includes a top surface 67, the lower layer 65 includes a bottom surface 69. A metallization layer pad 75 may be disposed on the top surface 67, As depicted, the metallization layer may be a pad, however, in some embodiments, the top surface 67 of the upper layer 63 may include a metallization layer that covers a portion or the entire top surface 67. The lower layer 65 includes a cooling chip inlet 68a, and a cooling chip outlet 70a, which are configured as openings. The cooling chip inlet 68a is longitudinally (i.e., along the +/−X-axis of the coordinate axes of FIG. 1) spaced apart from the cooling chip outlet 70a. The upper layer 63 is bonded to the lower layer 65 by any suitable process to form microchannels therein.

The upper layer 63 provides the plurality of microchannels 64 and the lower layer 65 provides an inlet and outlet as described in greater detail below. The upper layer 63 includes an inlet pocket 71 and an outlet pocket 73. The inlet pocket 71 is longitudinally (i.e., along the +/−X-axis of the coordinate axes of FIG. 1) spaced apart from the outlet pocket 73. Disposed between the inlet pocket 71 and the outlet pocket 73 is a plurality of microchannels 64. The plurality of microchannels 64 may extend longitudinally (i.e., along the +/−X-axis of the coordinate axes of FIG. 1) from the inlet pocket 71 to the outlet pocket 73. In the embodiment of the plurality of microchannels 64, as depicted in FIGS. 4C and 4D, the plurality of microchannels 64 are between the top surface 67 of the upper layer 63 and the bottom surface 69 of the lower layer 65. The plurality of microchannels 64 may be defined by an array of fins 66 for example, pin fins, channel fins, or the like, that collectively define at least a portion the fluid flow path. The array of fins 66 increase the surface area of the cooling chips 62a, 62b such that the cooling fluid 49 flowing therethrough may contact an increased surface area of the cooling chips 62a, 62b. As such, the plurality of microchannels 64 may be a straight design, as depicted in FIG. 3A, or curvilinear. Moreover, in some embodiments, the upper layer 63, the lower layer 65, the inlet pocket 71, the outlet pocket 73 and the plurality of microchannels 64a may be etched in semiconductor material such as silicon, for example.

Further, array of fins 66 are disposed at the cooling chip inlet 68 and the cooling chip outlet 70, such that the plurality of microchannels 64 of the cooling chips 62a, 62b are in fluid communication with the cooling chip inlet 68 and the cooling chip outlet 70.

The cooling chips 62a, 62b are coupled to the recesses 48 such that the cooling chip inlet opening 52a, 52b may be fluidly coupled to the plurality of microchannels 64a, 64b within the cooling chip 62a, 62b. In particular, the cooling chip inlet opening 52a, 52b may be fluidly coupled to the cooling chip inlet 68a, 68b. Further, the cooling chip outlet opening 54a, 54b may also be fluidly coupled to the plurality of microchannels 64a, 64b within the cooling chips 62a, 62b. In particular, the cooling chip outlet opening 54a, 54b may be fluidly coupled to the cooling chip outlet 70a, 70b. As such, when each of the cooling chips 62a, 62b are seated in each of the pair of recesses 48 of the manifold structure 14, the plurality of microchannels 64a, 64b of the cooling chips 62a, 62b are fluidly coupled to the manifold structure 14.

With reference to FIG. 3B, the cooling chip outlet opening 54a, 54b is fluidly coupled to the first integrated fluid channel 56. Therefore, the first integrated fluid channel 56 is disposed below the cooling chip outlet opening 54a, 54b in the vertical direction (i.e., in the +/−Z-direction depicted in FIG. 1). The first integrated fluid channel 56 fluidly couples each of the cooling chip outlet openings 54a, 54b into a single fluid cooling path 51. As such, it should also be appreciated that while the illustrations are depicted as having two cooling chip outlet openings 54a, 54b, the first integrated fluid channel 56 may extend in the longitudinal direction (i.e., in the +/−X-direction depicted in FIG. 1) so that more or less of the cooling chip outlet openings 54a, 54b may be fluidly coupled to the first integrated fluid channel 56.

Figure 3C:
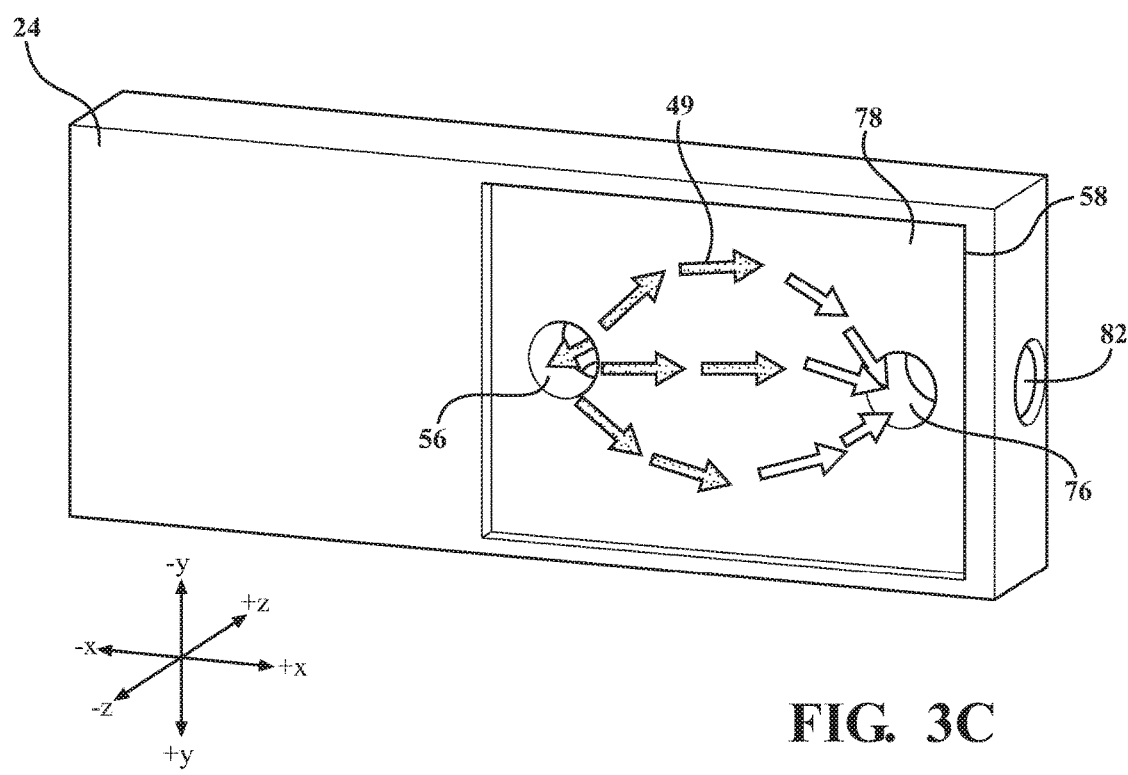
FIG. 3C schematically illustrates an isolated view of an example second cooling surface of the manifold structure according to one or more embodiments shown or described herein.

As best depicted in FIG. 3B, the first integrated fluid channel 56 is fluidly coupled to the cavity 58 of the second cooling surface 24. The second cooling surface 24 extends in the longitudinal direction (i.e., in the +/−X-direction depicted in FIG. 1) along a portion of the length of the manifold structure 14. As best depicted in FIG. 3C, the cavity 58 of the second cooling surface 24 extends in the longitudinal direction (i.e., in the +/−X-direction depicted in FIG. 1) along a portion of the length of the second cooling surface 24 of the manifold structure 14. Generally, the cavity 58 may extend in the longitudinal direction (i.e., in the +/−X-direction depicted in FIG. 1) from the first integrated fluid channel 56 to a fluid outlet 82. The first integrated fluid channel 56 opens into the cavity 58. Further, the cavity 58 fluidly couples the first integrated fluid channel 56 to a second integrated fluid channel 76.

The planar plate member 60 (FIG. 2) may be attached to the second cooling surface 24, which then creates a manifold between an inside surface 78 of the cavity 58 and an inner surface 80 (FIG. 5) of the planar plate member 60. As such, the cooling fluid 49 may make direct contact with the inside surface 78 of the cavity 58 and with the inner surface 80 of the planar plate member 60. Moreover, it should be appreciated that the cavity 58 and the planar plate member 60 may be longer in longitudinal direction (i.e., in the +/−X-direction depicted in FIG. 1) based on the placement of the first integrated fluid channel 56 and the fluid outlet 82. In a non-limiting example, if six recesses 48 where disposed in the first cooling surface 22, the first integrated fluid channel 56 would extend closer to the fluid outlet 82 so that the first integrated fluid channel 56 may fluidly couple to each of the cooling chip outlet openings 54. As such, the cavity 58, the second cooling surface 24 and the planar plate member 60 may also extend a shorter length in the longitudinal direction (i.e., in the +/−X-direction depicted in FIG. 1).

Referring again to FIG. 3B, the second integrated fluid channel 76 is longitudinally (i.e., in the +/−X-direction depicted in FIG. 1) spaced apart from the first integrated fluid channel 56. The second integrated fluid channel 76 is fluidly coupled to the fluid outlet 82. The second integrated fluid channel 76 fluidly couples the cavity 58 of the second cooling surface 24 to the fluid outlet 82 and merges the cooling fluid 49 into the single fluid cooling path 51. Further, it should also be appreciated that the second integrated fluid channel 76 may extend more or less in the longitudinal direction (i.e., in the +/−X-direction depicted in FIG. 1) depending of the length of the cavity 58.

Figure 5:
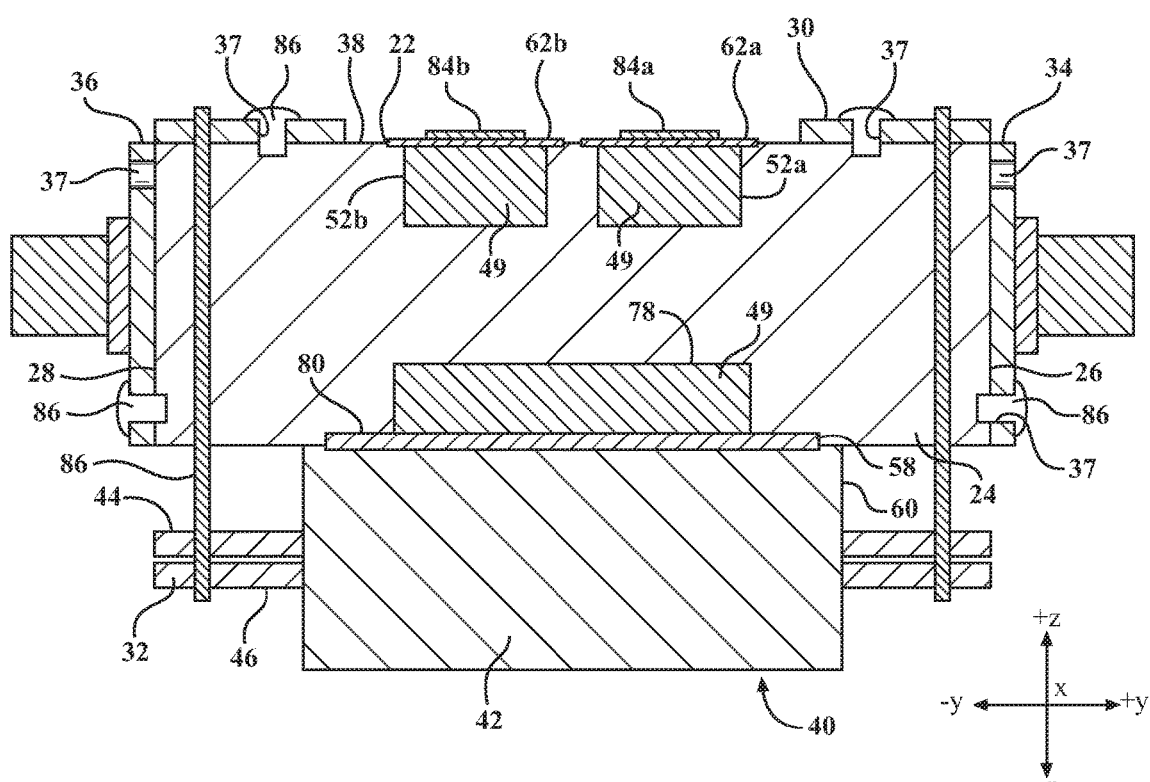
FIG. 5 schematically depicts a cross-sectional view of assembly of FIG. 1 taken from line 5-5 according to one or more embodiments described herein.

Now referring to FIG. 5, a cross-sectional view of FIG. 1 taken from line 5-5 is depicted. The cooling chips 62a, 62b are depicted as disposed in the pair of recesses 48. As such, the cooling chips 62a, 62b are fluidly coupled to the integrated fluid channel system 18. The semiconductor switches 84a, 84b are mounted directly to the metallization layer pad 75 disposed on the top surface 67 of each respective cooling chip 62a, 62b. Generally, the semiconductor switches 84a, 84b are mounted above the cooling chips 62a, 62b in the vertical direction (i.e., in the +/−Z-direction depicted in FIG. 1) by soldering, bonding and/or welding the semiconductor switch 84 in the proper alignment/position with the metallization layer pad 75 of the cooling chips 62a, 62b. As such, the semiconductor switches 84a, 84b are in direct contact with the cooling chips 62a, 62b. Therefore, the semiconductor switches 84a, 84b may be positioned between the first integrated fluid channel 56 and the second integrated fluid channel 76 and, more particularly, the semiconductor switches 84a, 84b may be positioned between the cooling chip inlet opening 52a, 52b and the cooling chip outlet opening 54a, 54b within the at least one pair of recesses 48. As such, the semiconductor switches 84a, 84b may receive the cooling fluid 49 directly from the fluid inlet 50, prior to the cooling fluid 49 having contact with other electronic components and thus before the temperature of the cooling fluid 49 increases, as will be discussed in greater detail below. It should be noted that while FIG. 5 depicts a pair of semiconductor switches 84a, 84b, it should also be appreciated that the assembly 10 is not limited to a pair of semiconductor switches 84a, 84b and may have less than two or more than two semiconductor switches 84a, 84b in the assembly 10 and/or may have more than one semiconductor switch mounted on each of the cooling chips 62a, 62b.

It should also be appreciated that the semiconductor switches 84a, 84b may be wide band gap (WBG) semiconductor devices as a non-limiting example. As such, the WBG semiconductor switch may comprises a WBG material, such as, without limitation SiC, GaN, Ga2O3, AlN, BN, diamond, or the like. As a non-limiting example, the WBG may be any semiconductor material comprising a bandgap of about 3 eV or more. In some embodiments, the WBG semiconductor switch may comprise an insulated-gate bi-polar transistor ("IGBT"), a metal-oxide-semiconductor field-effect transistor ("MOSFET") or any other semiconductor switching device. Further, as a non-limiting example, the WBG semiconductor switch may operate at temperatures between about 250° C. and about 350° C. It should be understood that other operation temperatures are possible.

Referring again to FIG. 5, the aperture 38 of the first PCB 30 permits the cooling chips 62a, 62b and the semiconductor switches 84a, 84b to pass through the aperture 38 such that the first PCB 30 may be seated in a planar manner onto the first cooling surface 22 of the manifold structure 14. The second PCB 32 is coupled so that the magnetic core 42 or coil or of the at least one inductor 40 is in contact with the planar plate member 60 within the cavity 58 of the second cooling surface 24. The PCBs assembly 16 is depicted as having the plurality of through holes 37 in which a plurality of fasteners 86, such as screws and/or bolts and nuts, and/or threaded rod are used to attach the PCB assembly 16 to the manifold structure 14. It should be appreciated that the PCBs assembly 16 may also be attached to the manifold structure 14 by the plurality of bonding materials such as, without limitation, epoxy with and without woven glass-reinforcement, Teflon, and/or bondply. It should also be appreciated that flex PCB may be used as described herein.

With reference still to FIG. 5, the third PCB 34 and the fourth PCB 36 are laterally spaced apart (i.e., in the +/−Y-direction depicted in FIG. 1) from the cavity 58, the cooling chips 62a, 62b and the cooling fluid 49 such that the third PCB 34 and the fourth PCB 36 are not in direct contact with the cooling fluid 49. However, it should be appreciated that the integrated fluid channel system 18 may be altered to direct the cooling fluid 49 to the first side surface 26 and/or the second side surface 28 so to provide direct contact with the cooling fluid 49 should the third PCB and/or the fourth PCB have electronic devices 12 that require the cooling fluid to direct heat away.

Further, the integrated fluid channel system 18 may be altered to change the cooling chip inlet opening 52a, 52b and the cooling chip outlet opening 54a, 54b such that the recesses 48, the cooling chip inlet opening 52a, 52b and/or the cooling chip outlet opening 54a, 54b may have a greater width, in the lateral direction (i.e., in the +/−Y-direction depicted in FIG. 1). Further, the cavity 58 of the second cooling surface 24 may have varying widths, in the lateral direction (i.e., in the +/−Y-direction depicted in FIG. 1). Moreover, in alternative embodiments, the magnetic core 42 or coil of the at least one inductor 40 may be in direct contact with the cavity 58 of the manifold structure 14 instead of the planar plate member 60.

Figure 6:
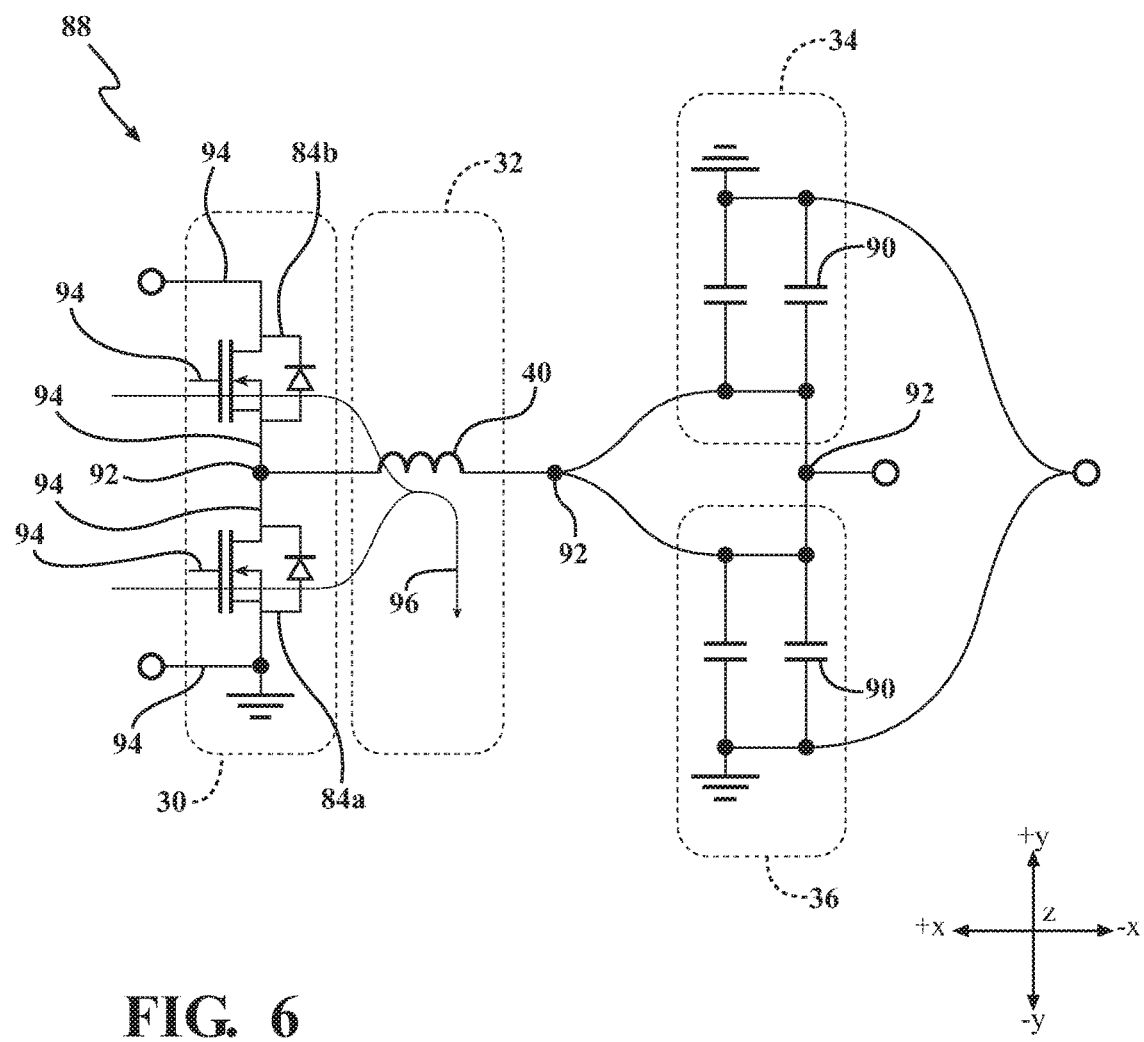
FIG. 6 schematically depicts an example isolated overhead converter circuit according to one or more embodiments described herein.

The assembly 10 may be configured to provide any type of electrical circuit. Now referring to FIG. 6, an example converter circuit that may be implemented by the assembly 10 of FIG. 1 is schematically depicted. As depicted in the circuit diagram, the example converter circuit is a Buck converter 88. The example Buck converter 88 includes the two semiconductor switches 84a, 84b, the at least one inductor 40, and the plurality of capacitors 90 in parallel with one another. The semiconductor switches 84a, 84b are thermally and/or electrically connected to the first PCB 30 and the at least one inductor 40 is thermally and/or electrically connected to the second PCB 32. The PCBs assembly 16 may be electrically connected to one another by a plurality of board-to-board connectors 92. Further, the semiconductor switches 84 may be electrically connected to first PCB 30 by a plurality of bond-wires 94. It should be appreciated that while the Buck converter 88 is illustrated as stepping down the voltage, any type of circuit (e.g., an inverter, rectifier and/or the like) may be provided by the assembly 10. Furthermore, less than four PCBs or more than four PCBs may be used in the circuit and attached to the manifold structure 14. Additionally, more less than two semiconductor switches 84a, 84b may be used, more than one at least one inductor 40 may be used, and more or less than four of the capacitors 90 depicted may be used. Further, the coordinate system, as depicted in FIG. 6 is to provide reference to the example circuit in the illustrated isolated overhead view only. It should be appreciated that the example circuit may be on different planes, which may be parallel to one another, perpendicular to one another, or a combination thereof.

With reference to FIGS. 3A-4D, the fluid flow of cooling fluid within the assembly 10 will now be described. The cooling fluid 49 is initially introduced into the fluid inlet 50 where the cooling fluid is circulated through the integrated fluid channel system 18 to remove heat from the plurality of electronic devices 12. As such, the amount of the cooling fluid 49 and/or the temperature of the cooling fluid 49 circulated at the plurality of electronic devices 12 and/or electronic components may be controlled based on the integrated fluid channel system 18 and the placement of the plurality of electronic devices 12 and/or electronic components.

The cooling fluid 49 may be a dielectric cooling fluid, such as, without limitation, R-245fa and HFE-7100. Other dielectric cooling fluids may be utilized. The type of dielectric cooling fluid chosen may depend on the operating temperature of the heat generating devices to be cooled.

Referring to FIG. 3B, the cooling fluid 49 is circulated through the integrated fluid channel system 18 from the fluid inlet 50 in the longitudinal direction (i.e., in the +/−X-direction depicted in FIG. 1) to each of the cooling chip inlet opening 52a, 52b, in which the cooling fluid is separated such that the cooling fluid flows into each of the cooling chip inlet opening 52a, 52b. From this point, the cooling fluid flow will be described for each cooling chip 62a, 62b.

With reference to FIGS. 3B and 4A, 4B, 4C, and 4D, the cooling fluid 49 flows from the cooling chip inlet opening openings 52a, 52b into the cooling chip inlet 68, into the inlet pocket 71 through the plurality of microchannels 64 and into the outlet pocket 73 of each respective cooling chip 62a, 62b. The cooling fluid 49 then flows from the outlet pocket 73 of the cooling chips 62a, 62b and then to the cooling chip outlet openings 54a, 54b. The cooling fluid 49, while in the plurality of microchannels 64, assists in cooling the top surface 67 of the upper layer 63. The semiconductor switches 84a, 84b are in direct contact with the upper layer 63 such that the cooling fluid 49 removes heat from the semiconductor switches 84a, 84b. As such, the cooling fluid 49 increases in temperature as it flows through the plurality of microchannels 64 and out of the cooling chip outlet 70 into the cooling chip outlet openings 54a, 54b.

Once the cooling fluid 49 is in the cooling chip outlet opening 54a, 54b the cooling fluid 49 is merged at the first integrated fluid channel 56. The first integrated fluid channel 56 directs the cooling fluid 49 onto the second cooling surface 24 of the manifold structure 14. As such, the cooling fluid 49 is directed in the longitudinal direction (i.e., in the +/−X-direction depicted in FIG. 1) across the axial length of the second cooling surface 24. At the second cooling surface 24, the cooling fluid 49 is directed along the planar plate member 60 within the cavity 58, as best depicted in FIGS. 3C and 5. The cooling fluid 49 may make direct contact with the inner surface 80 of planar plate member 60 and an inside surface 78 of the cavity 58 such that a manifold is formed. It should be appreciated that the cooling fluid 49 may spread across the inside surface 78 of the cavity 58 in the lateral direction (i.e., in the +/−X-direction depicted in FIG. 1). As such, it should be appreciated that the cooling fluid 49 may make contact with a substantial portion of the inner surface 80 planar plate member 60 within the cavity 58 of the second cooling surface 24. It should also be appreciated that the cooling fluid 49 may be directed in a single path across the inside surface 78 of the cavity 58 such that the cooling fluid 49 does not necessary need to be spread out across any surfaces.

The second integrated fluid channel 76 is fluidly coupled to the cavity 58 such that the cooling fluid 49 flows from the cavity 58 of the second cooling surface 24 into second integrated fluid channel 76 in the vertical direction (i.e., in the +/−Z-direction depicted in FIG. 1). Again, as best depicted in FIG. 3B, the cooling fluid is merged into the second integrated fluid channel from either a direct flow configuration or, as illustrated, a spread flow configuration. The second integrated fluid channel 76 directs the cooling fluid into the fluid outlet 82, which in turn directs the fluid out of the manifold structure 14. The second fluid integrated fluid channel may direct the cooling fluid in the vertical direction (i.e., in the +/−Z-direction depicted in FIG. 1) away from the second cooling surface 24 such that the cooling fluid is positioned in between the first cooling surface 22 and the second cooling surface 24.

With reference to FIG. 6, a cooling fluid flow 96 over the various electrical components of the example Buck converter 88 is schematically depicted. The cooling fluid flow 96 indicates that the semiconductor switches 84a, 84b are independently cooled before the cooling fluid 49 is merged to cool the at least one inductor 40 after cooling the semiconductor switches 84a, 84b. As such, the operating temperature of the semiconductor switches 84a, 84b and the at least one inductor 40 may be controlled by the cooling fluid 49. Further, the cooling fluid flow 96 indicates that the third PCB 34 and the fourth PCB 36 are not in contact with the flow of the cooling fluid flow 96 and those plurality of electronic devices 12 coupled to the third PCB 34 and the fourth PCB 36 are not in direct cooling with the cooling fluid 49.

The integrated fluid channel system 18 that provides cooling fluid from the fluid inlet 50 to the fluid outlet 82 may be connected to a pump (not shown) such that the cooling fluid may be pumped through the fluid inlet 50 and out of the fluid outlet 82 as described above. In operation, the cooling fluid flowing through the integrated fluid channel system 18 may remove heat from one or more heat generating devices thermally coupled to the semiconductor cooling chips, for example, the semiconductor switches 84a, 84b, the first cooling surface 22, and/or the second cooling surface 24. A cooling fluid reservoir (not shown) may be fluidly connected to the fluid pump (not shown), the fluid inlet 50 and/or the fluid outlet 82 such that the cooling fluid reservoir (not shown) may house the cooling fluid 49, and the fluid pump (not shown) may pump the cooling fluid 49 through the integrated fluid channel system 18. For example, the cooling fluid may be pumped from the cooling fluid reservoir (not shown) into the fluid inlet 50, through the integrated fluid channel system 18 and out of the fluid outlet 82 back into the cooling fluid reservoir (not shown). Further, a secondary heat exchanger (not shown) may remove heat collected by the cooling fluid 49 before the cooling fluid enters the cooling fluid reservoir (not shown).

As a result of the integrated fluid channel system 18, it should be appreciated that the cooling fluid 49 is warmer across the second cooling surface 24 than at the fluid inlet 50 from passing through the microchannels 64 of the cooling chip 62 before the second cooling surface 24. It should also be appreciated that the versatility of the assembly 10 permits the cooling fluid 49 to cool some components prior to others so that the cooling fluid 49 increases in temperature from the fluid inlet 50 to the fluid outlet 82. For instance, the semiconductor switches 84a, 84b may need a lower temperature cooling fluid 49 than the temperature needed at the second cooling surface 24 and, as such, the semiconductor switches 84a, 84b receive the lowest temperature cooling fluid of the assembly 10.

The above-described cooling assembly provides significant downsizing of the power electronics packaging by having the manifold structure as part of the electronics as opposed to bolt on attachment. Further, the circuit board and power electronics arrangement increases volumetric power density while permitting fewer thermal interfaces, which in turn, reduces the thermal resistance of the assembly. As a result, the cooling assembly permits power electronics to have a cooling scheme in a much small package size resulting in more versatility in electronic packages.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An assembly comprising:
    a manifold structure, the manifold structure comprising:
        a fluid inlet;
        a fluid outlet, wherein the fluid inlet is for receiving a cooling fluid into the manifold structure, and the fluid outlet is for removing the cooling fluid from the manifold structure;
        a first cooling surface and an opposite second cooling surface, wherein:
            the first cooling surface comprises a cooling chip inlet opening fluidly coupled to a cooling chip outlet opening;
            the fluid inlet is fluidly coupled to the cooling chip inlet opening; and
            the second cooling surface comprise a cavity;
        a first integrated fluid channel fluidly coupling the cooling chip outlet opening to the cavity;
        a second integrated fluid channel fluidly coupling the cavity to the fluid outlet;
    a cooling chip comprising a plurality of microchannels, wherein the cooling chip is coupled to the first cooling surface of the manifold structure such that the plurality of microchannels is fluidly coupled to the cooling chip inlet opening and the cooling chip outlet opening.

2. The assembly of claim 1, wherein the manifold structure comprises an inlet end that is opposite an outlet end, the fluid inlet is at the inlet end, and the fluid outlet is at the outlet end.

3. The assembly of claim 1, wherein the first cooling surface of the manifold structure comprises a recess surrounding the cooling chip inlet opening and the cooling chip outlet opening, and the cooling chip is disposed within the recess such that the plurality of microchannels faces the first cooling surface.

4. The assembly of claim 3, further comprising at least one electronic device thermally coupled to the cooling chip.

5. The assembly of claim 4, wherein the at least one electronic device is in direct contact with at least a portion of the plurality of microchannels.

6. The assembly of claim 4, further comprising a planar plate member coupled to the second cooling surface such that a manifold is defined within the cavity between the second cooling surface and the planar plate member.

7. The assembly of claim 6, wherein a second electronic device is thermally coupled to the planar plate member.

8. The assembly of claim 7, wherein the at least one electronic device comprises a semiconductor device and the second electronic device comprises an inductor of a converter circuit.

9. The assembly of claim 7, further comprising a first circuit board, a second circuit board, a third circuit board and a fourth circuit board, wherein:
    the manifold structure comprises a first side surface and an opposite second side surface; and
    the first circuit board is coupled to the first cooling surface, the second circuit board is mounted to the second cooling surface, the third circuit board is mounted to the first side surface and the fourth circuit board is mounted to the second side surface.

10. The assembly of claim 9, wherein the at least one electronic device is electrically coupled to the first circuit board and the second electronic device is electrically coupled to the second circuit board.

11. The assembly of claim 9, wherein:
    the at least one electronic device comprises a semiconductor device electrically coupled to the first circuit board;
    the second electronic device comprises an inductor electrically coupled to the second circuit board; and
    the assembly further comprises a first plurality of electronic devices electrically coupled to the third circuit board and a second plurality of electronic devices electrically coupled to the fourth circuit board.

12. An electronics assembly comprising:
    a cooling assembly comprising:
        a manifold structure, the manifold structure comprising:
            a fluid inlet;
            a fluid outlet, wherein the fluid inlet is for receiving a cooling fluid into the manifold structure, and the fluid outlet is for removing the cooling fluid from the manifold structure;
            a first cooling surface and an opposite second cooling surface, wherein:
                the first cooling surface comprises a cooling chip inlet opening fluidly coupled to a cooling chip outlet opening;
                the fluid inlet is fluidly coupled to the cooling chip inlet opening; and
                the second cooling surface comprise a cavity;
            a first integrated fluid channel fluidly coupling the cooling chip outlet opening to the cavity;
            a second integrated fluid channel fluidly coupling the cavity to the fluid outlet;
        a cooling chip comprising a plurality of microchannels, wherein the cooling chip is disposed within a recess of the first cooling surface of the manifold structure such that the plurality of microchannels is fluidly coupled to the cooling chip inlet opening and the cooling chip outlet opening;
        a planar plate member coupled to the second cooling surface such that a manifold is defined within the cavity between the second cooling surface and the planar plate member;
    at least one semiconductor device thermally coupled to the cooling chip; and
    at least one inductor thermally coupled to the planar plate member.

13. The electronics assembly of claim 12, wherein the electronics assembly defines a converter circuit.

14. The electronics assembly of claim 12, wherein the at least one semiconductor device is thermally coupled to the cooling chip such that the at least one semiconductor device is in direct contact with the plurality of microchannels.

15. The electronics assembly of claim 14, further comprising a first circuit board, a second circuit board, a third circuit board and a fourth circuit board, wherein:
the manifold structure has a first side surface and an opposite second side surface;
the first circuit board is mounted to the first cooling surface, the second circuit board is mounted to the second cooling surface, the third circuit board is mounted to the first side surface and the fourth circuit board is mounted to the second side surface.

16. The electronics assembly of claim 15, wherein:
the electronics assembly further comprises a first plurality of electronic devices electrically coupled to the third circuit board and a second plurality of electronic devices electrically coupled to the fourth circuit board;
the at least one semiconductor device is electrically coupled to the first circuit board; and
the inductor is electrically coupled to the second circuit board.

17. A cooling assembly comprising:
a manifold structure, the manifold structure comprising:
a fluid inlet;
a fluid outlet, wherein the fluid inlet is for receiving a cooling fluid into the manifold structure, and the fluid outlet is for removing the cooling fluid from the manifold structure;
a first cooling surface and an opposite second cooling surface, wherein:
the first cooling surface comprises a first cooling chip inlet opening fluidly coupled to a first cooling chip outlet opening, and a second cooling chip inlet opening fluidly coupled to a second cooling chip outlet opening;
the fluid inlet is fluidly coupled to the first cooling chip inlet opening and the second cooling chip inlet opening; and
the second cooling surface comprise a cavity;
a first integrated fluid channel fluidly coupling the first cooling chip outlet opening and the second cooling chip outlet opening to the cavity; and
a second integrated fluid channel fluidly coupling the cavity to the fluid outlet; and
a first cooling chip and a second cooling chip each comprising a plurality of microchannels, wherein the first cooling chip and the second cooling chip are coupled to the first cooling surface of the manifold structure such that the plurality of microchannels of the first cooling chip is fluidly coupled to the first cooling chip inlet opening and the first cooling chip outlet opening, and the plurality of microchannels of the second cooling chip is fluidly coupled to the second cooling chip inlet opening and the second cooling chip outlet opening.

18. The cooling assembly of claim 17, further comprising a planar plate member coupled to the second cooling surface such that a manifold is defined within the cavity between the second cooling surface and the planar plate member.

19. The cooling assembly of claim 17, wherein the first cooling surface of the manifold structure comprises a first recess surrounding the first cooling chip inlet opening and the first cooling chip outlet opening, and a second recess surrounding the second cooling chip inlet opening and the second cooling chip outlet opening.

20. The cooling assembly of claim 17, wherein the manifold structure is fabricated from polyether ether ketone.

* * * * *